(12) United States Patent
Lee et al.

(10) Patent No.: US 11,158,668 B2
(45) Date of Patent: Oct. 26, 2021

(54) SEMICONDUCTOR MODULE AND DISPLAY DEVICE INCLUDING SAME

(71) Applicant: LG INNOTEK CO., LTD., Seoul (KR)

(72) Inventors: Sang Youl Lee, Seoul (KR); Chung Song Kim, Seoul (KR); Yong Tae Moon, Seoul (KR); Ji Hyung Moon, Seoul (KR); Sun Woo Park, Seoul (KR); Hyeon Min Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/648,860

(22) PCT Filed: Sep. 19, 2018

(86) PCT No.: PCT/KR2018/011032
§ 371 (c)(1),
(2) Date: Mar. 19, 2020

(87) PCT Pub. No.: WO2019/059628
PCT Pub. Date: Mar. 28, 2019

(65) Prior Publication Data
US 2020/0286949 A1 Sep. 10, 2020

(30) Foreign Application Priority Data
Sep. 19, 2017 (KR) .......................... 10-2017-0120541

(51) Int. Cl.
*H01L 27/15* (2006.01)
*H01L 33/50* (2010.01)

(52) U.S. Cl.
CPC .......... *H01L 27/156* (2013.01); *H01L 33/505* (2013.01)

(58) Field of Classification Search
CPC ..... H01L 27/156; H01L 25/0753; H01L 33/08
See application file for complete search history.

(56) References Cited

U.S. PATENT DOCUMENTS

| 2013/0161660 A1 | 6/2013 | Matsuura et al. |
| 2014/0120640 A1 | 5/2014 | Shieh et al. |
| (Continued) | | |

FOREIGN PATENT DOCUMENTS

| JP | 2002-182580 A | 6/2002 |
| JP | 2002-344028 A | 11/2002 |
| (Continued) | | |

*Primary Examiner* — Changhyun Yi
(74) *Attorney, Agent, or Firm* — Birch, Stewart, Kolasch & Birch, LLP

(57) ABSTRACT

Disclosed in an embodiment is a display device comprising a panel substrate and a plurality of semiconductor devices disposed on the panel substrate, wherein the panel substrate includes first and second regions disposed in a first direction, the plurality of semiconductor devices include a plurality of first semiconductor devices disposed in the first region and a plurality of second semiconductor devices disposed in the second region, the wavelength deviation between the first semiconductor device disposed at the edge of the first region and the second semiconductor device disposed at the edge of the second region is within 2 nm, and the wavelength pattern of the plurality of first semiconductor devices in the first direction is the same as the wavelength pattern of the plurality of second semiconductor devices in the first direction.

19 Claims, 21 Drawing Sheets

(56) References Cited

U.S. PATENT DOCUMENTS

2017/0373046 A1   12/2017  Gardner et al.
2018/0190672 A1*   7/2018  Lee ..................... H01L 25/0753

FOREIGN PATENT DOCUMENTS

| KR | 10-2013-0074763 A | 7/2013 |
| KR | 10-2015-0082414 A | 7/2015 |
| KR | 10-2017-0096127 A | 8/2017 |

\* cited by examiner

[FIG. 1]
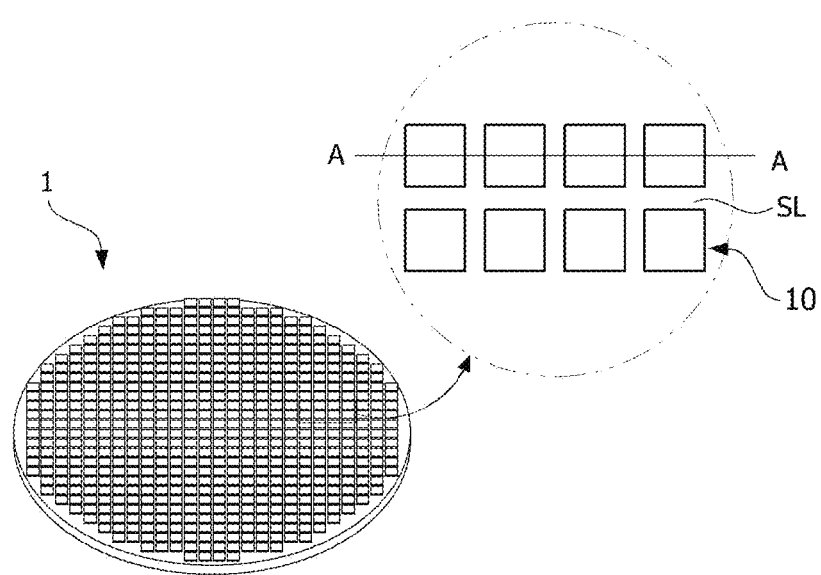

[FIG. 2]
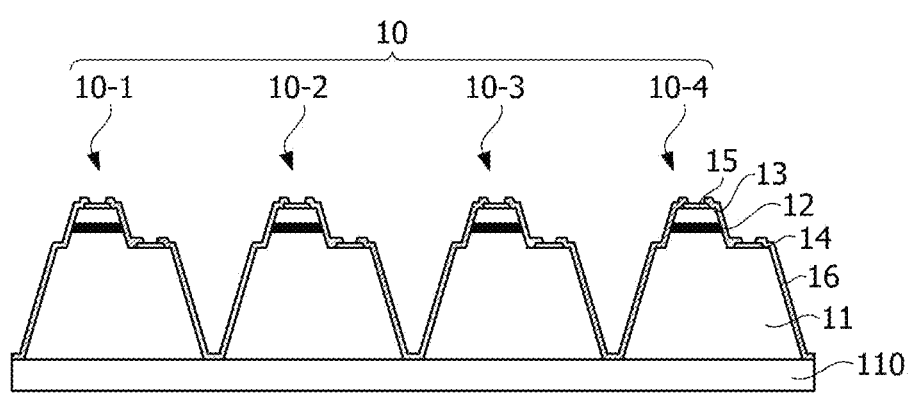

[FIG. 3]
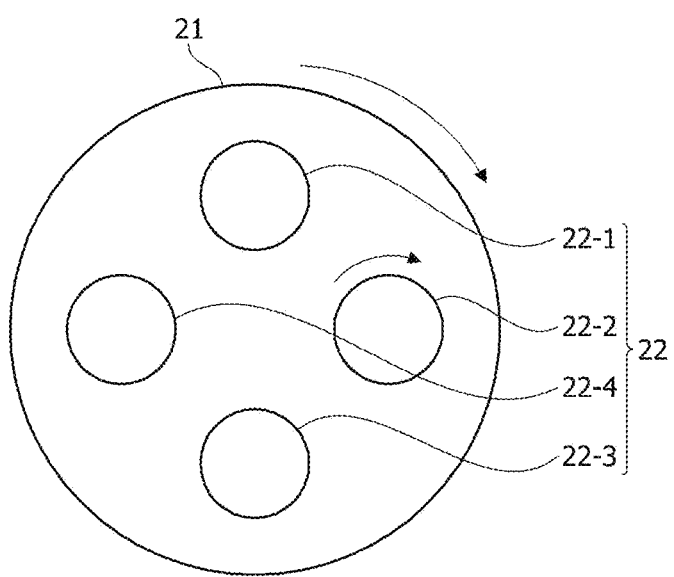

[FIG. 4]
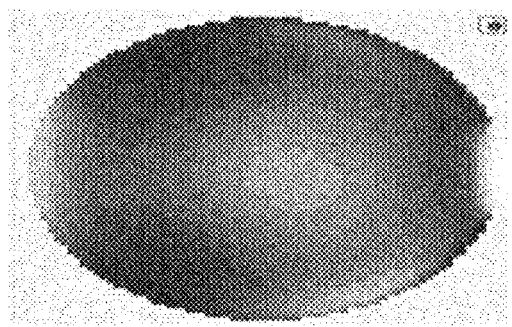

[FIG. 5]
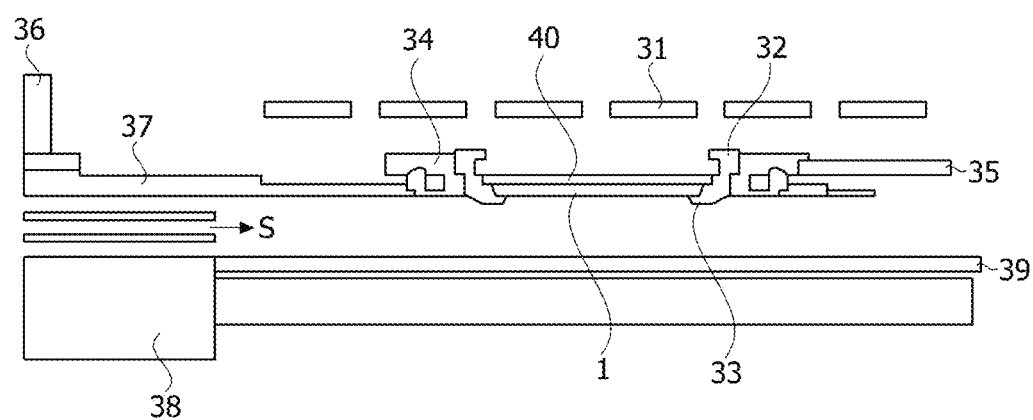

[FIG. 6]
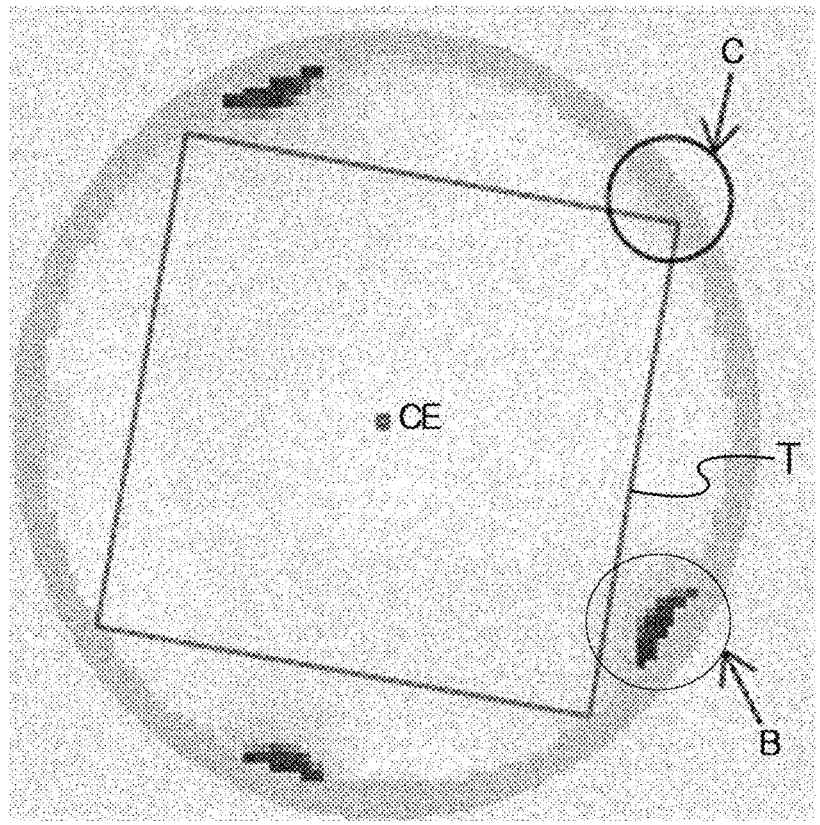

[FIG. 7A]
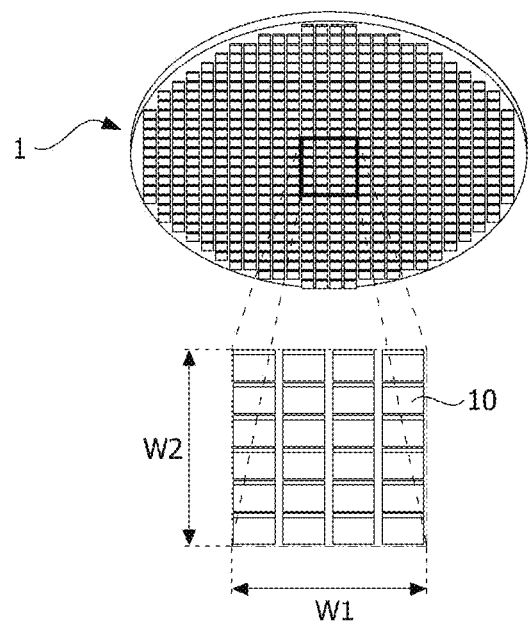

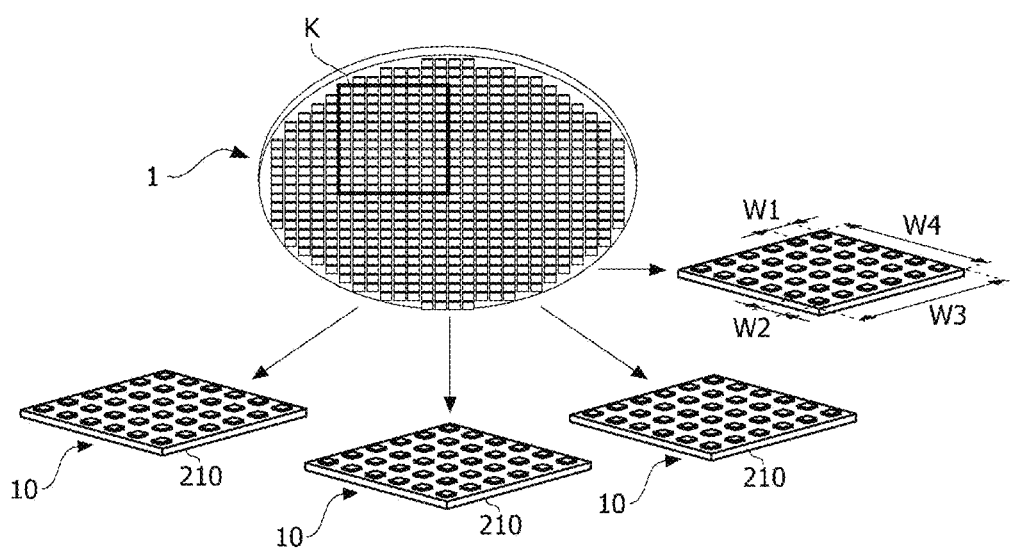
[FIG. 7B]

[FIG. 8A]
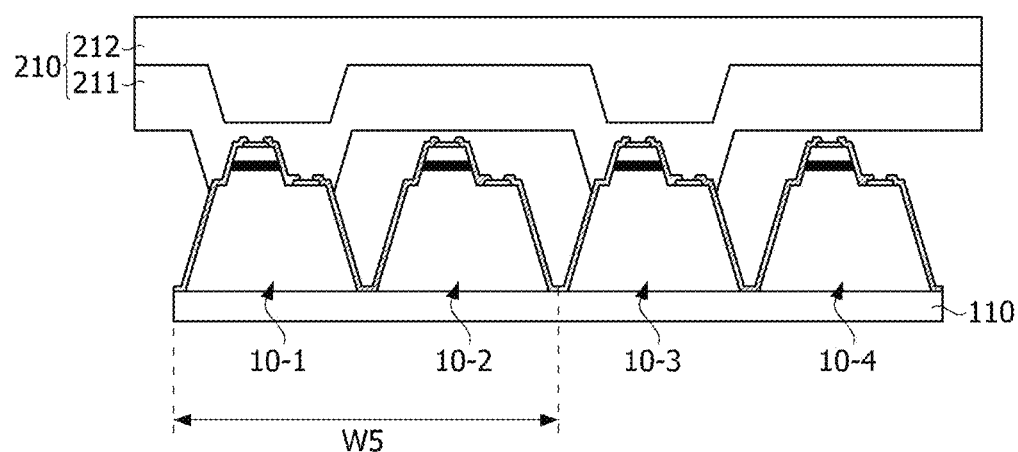

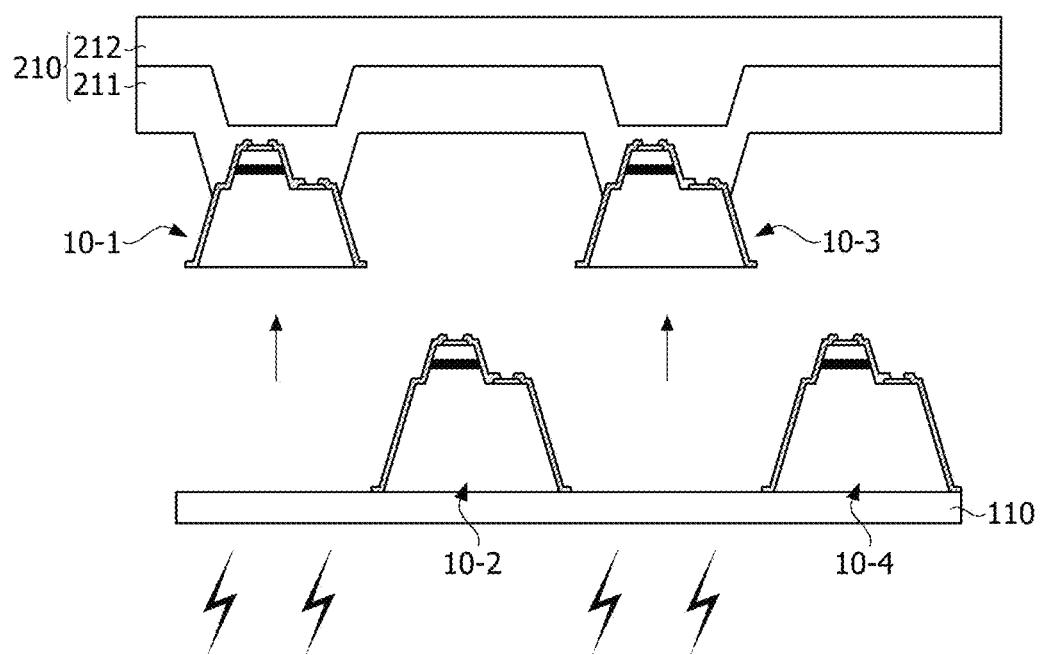
[FIG. 8B]

[FIG. 9]
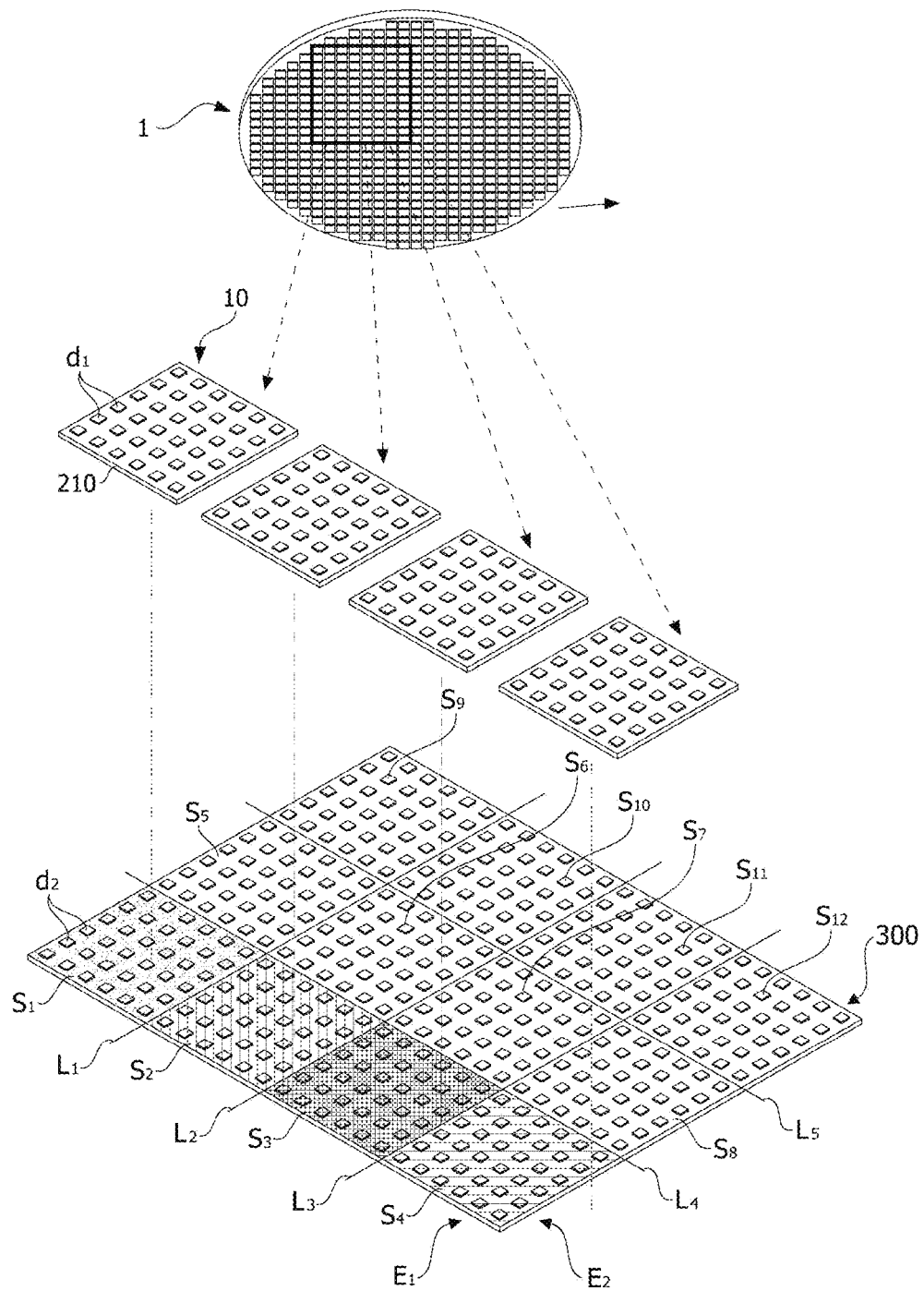

[FIG. 10A]
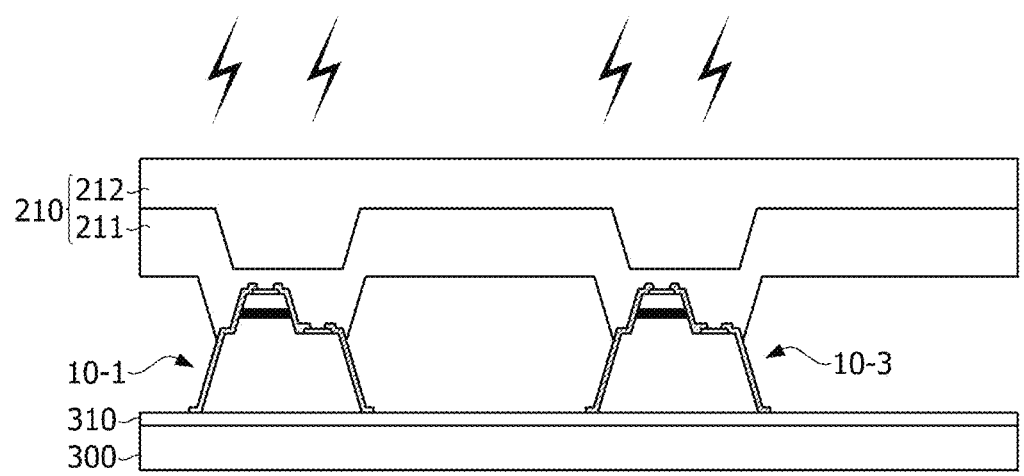

[FIG. 10B]
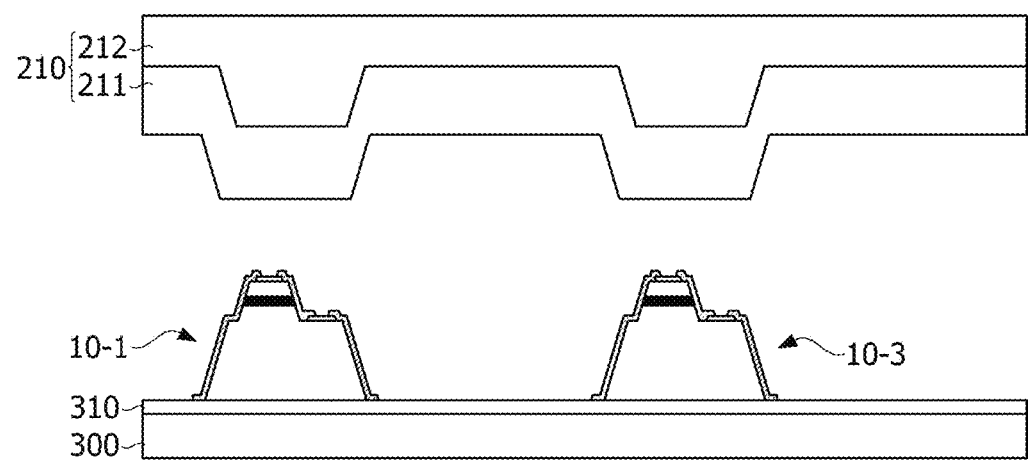

[FIG. 11]
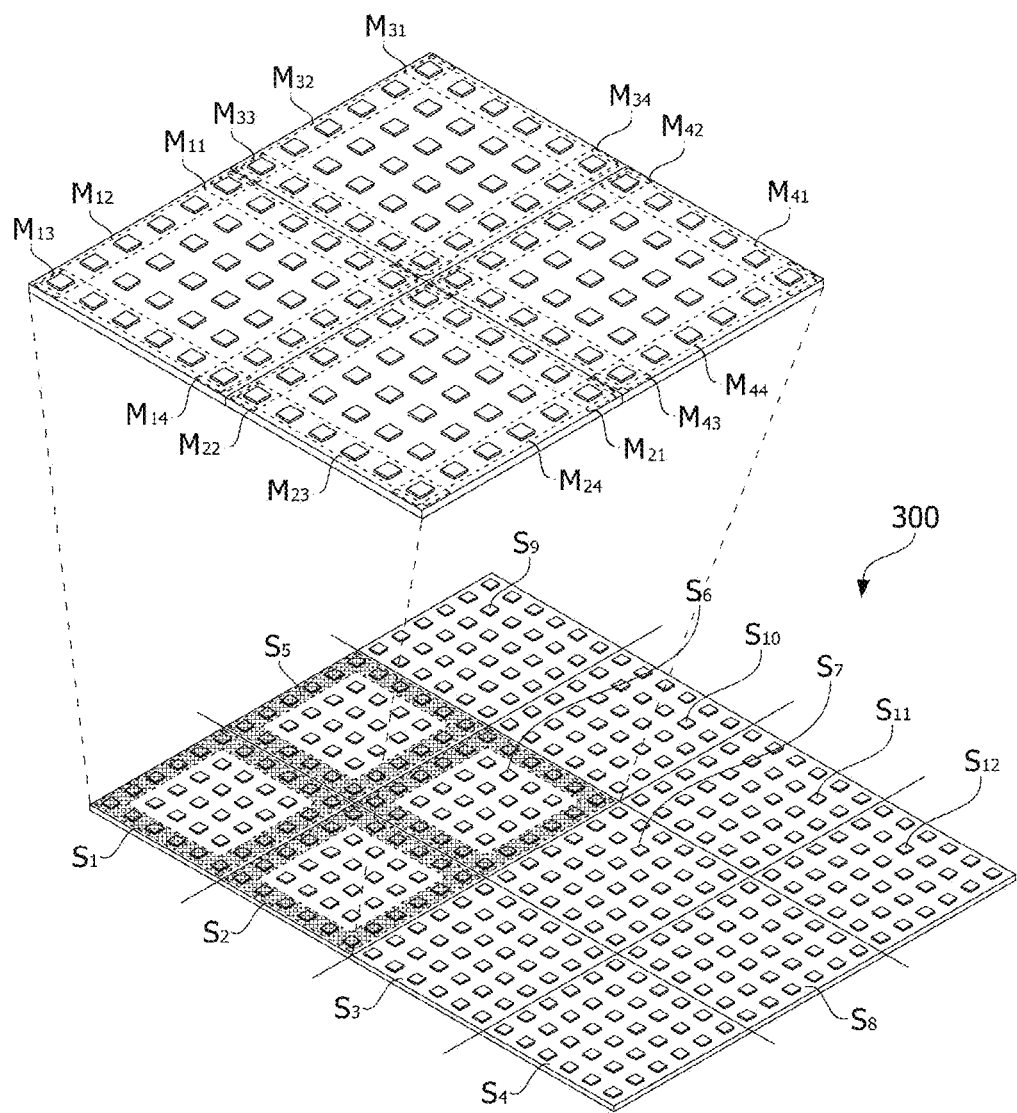

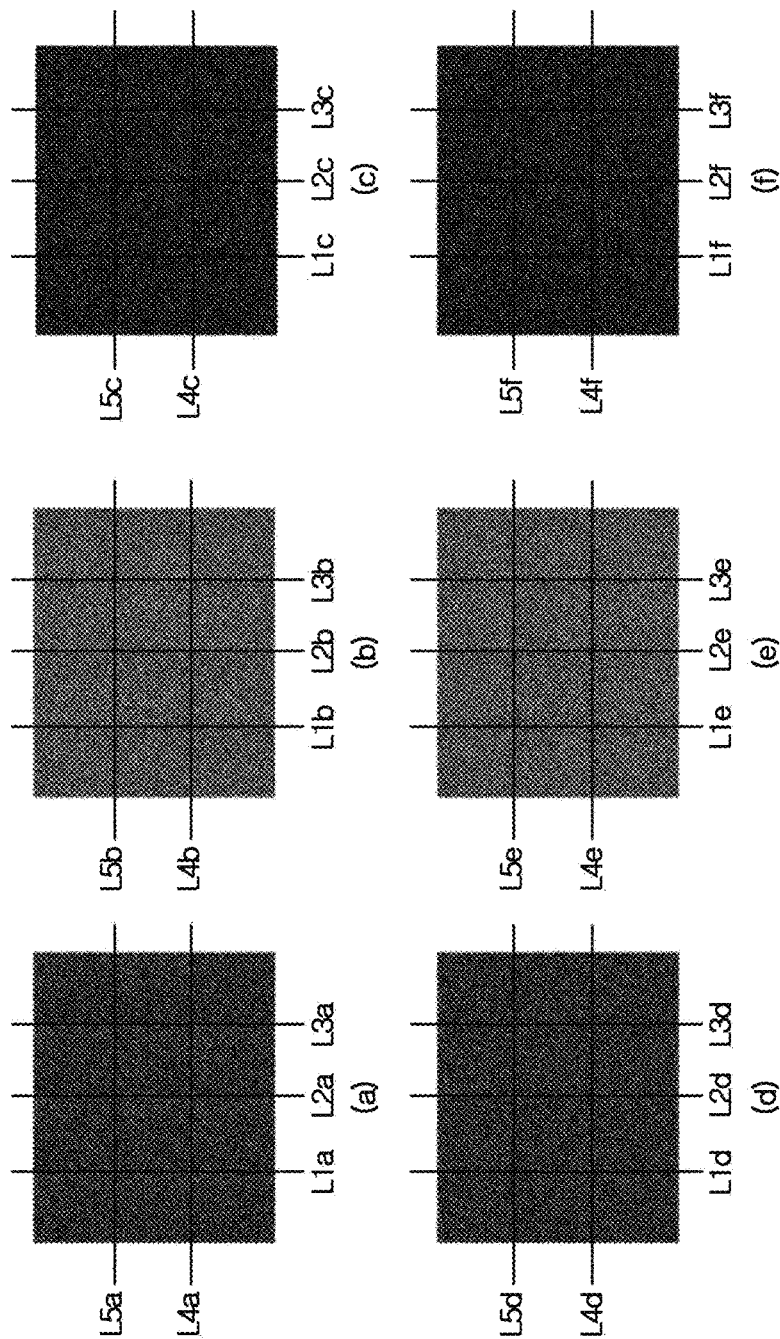
[FIG. 12]

[FIG. 13A]
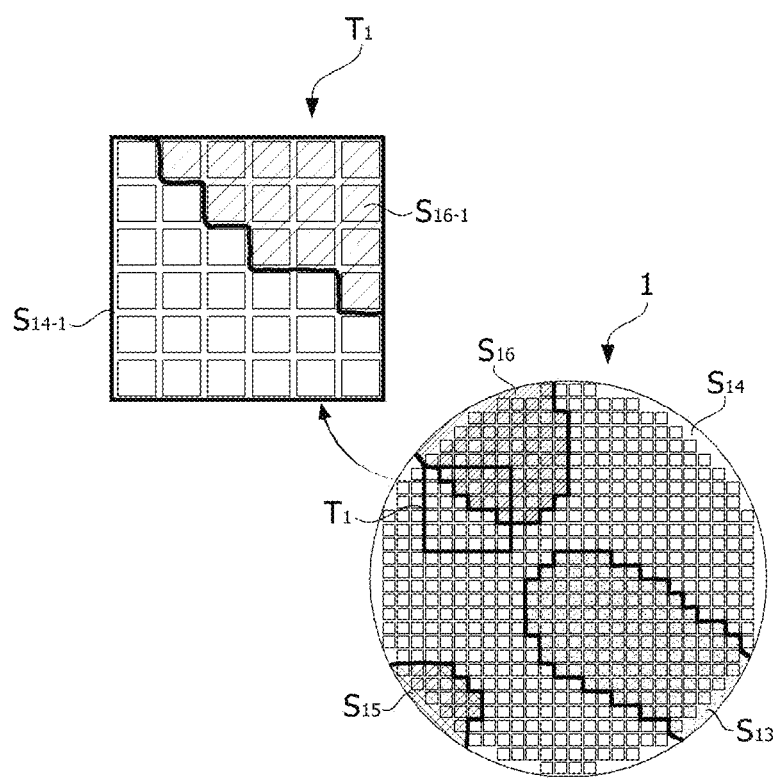

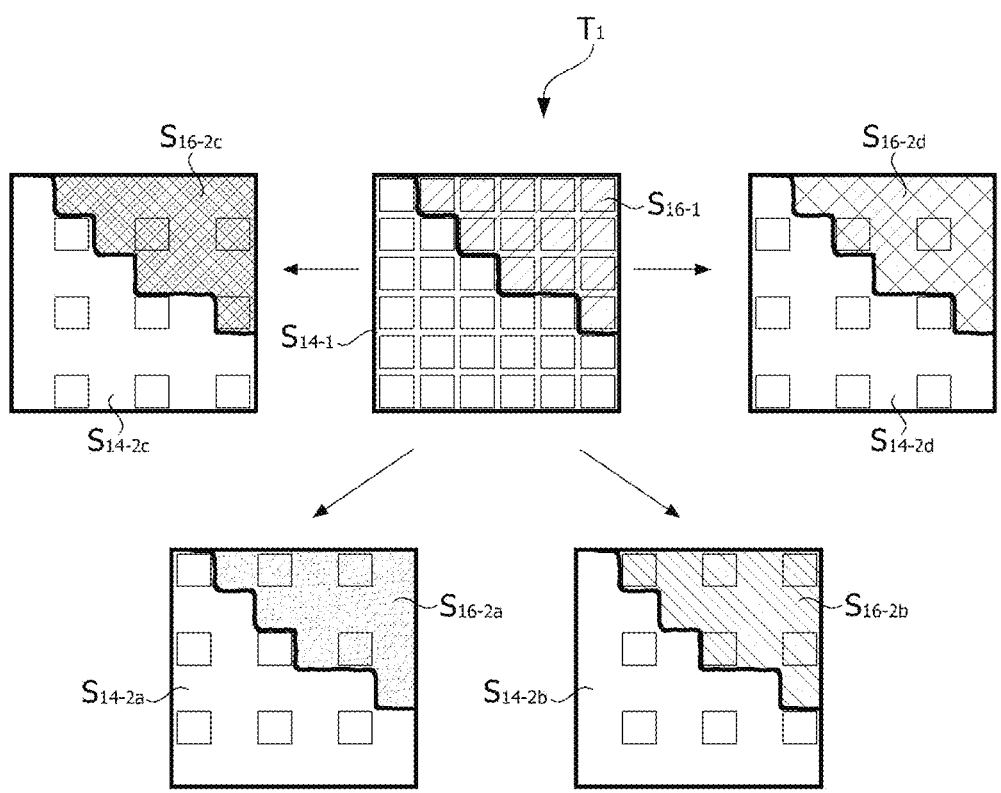
[FIG. 13B]

[FIG. 13C]
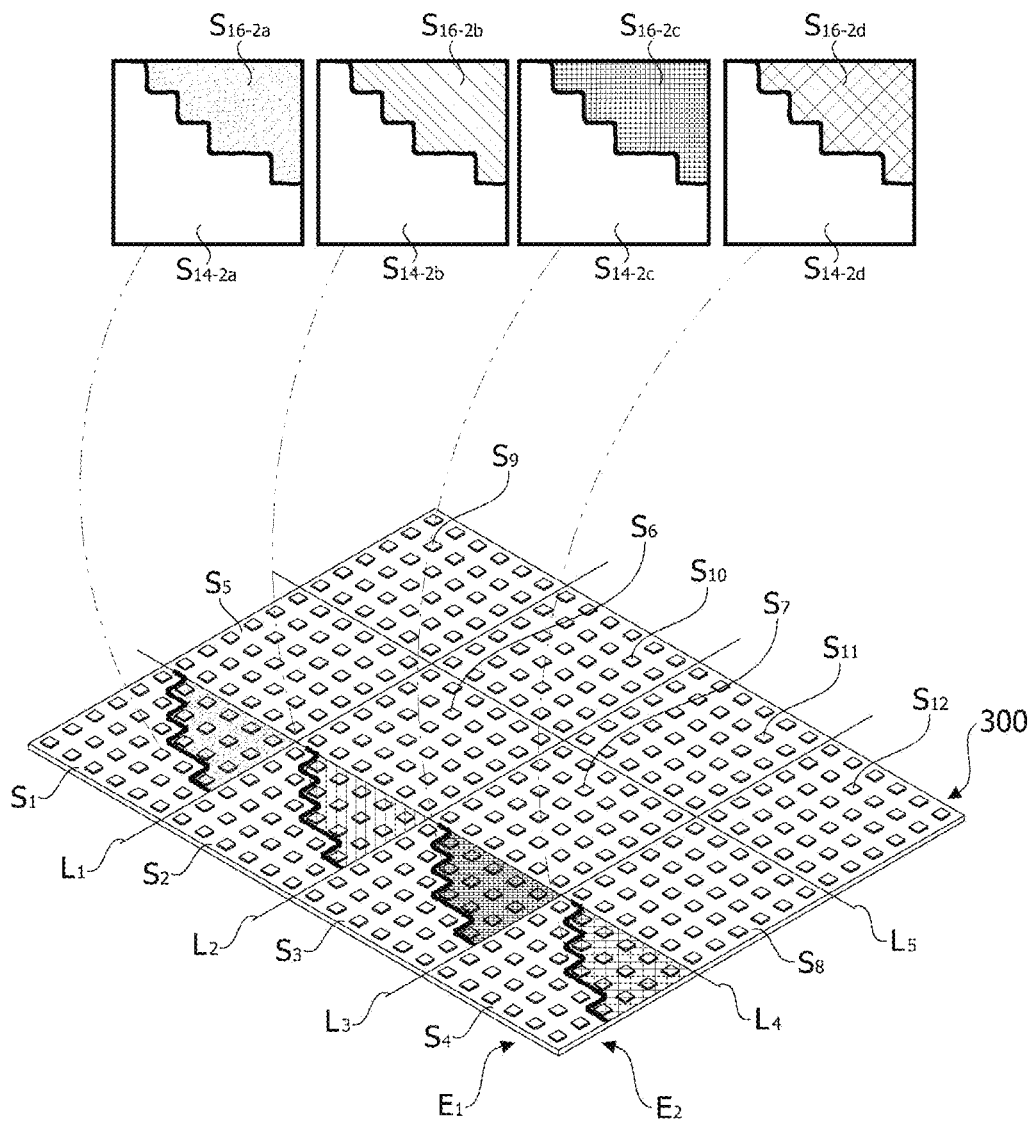

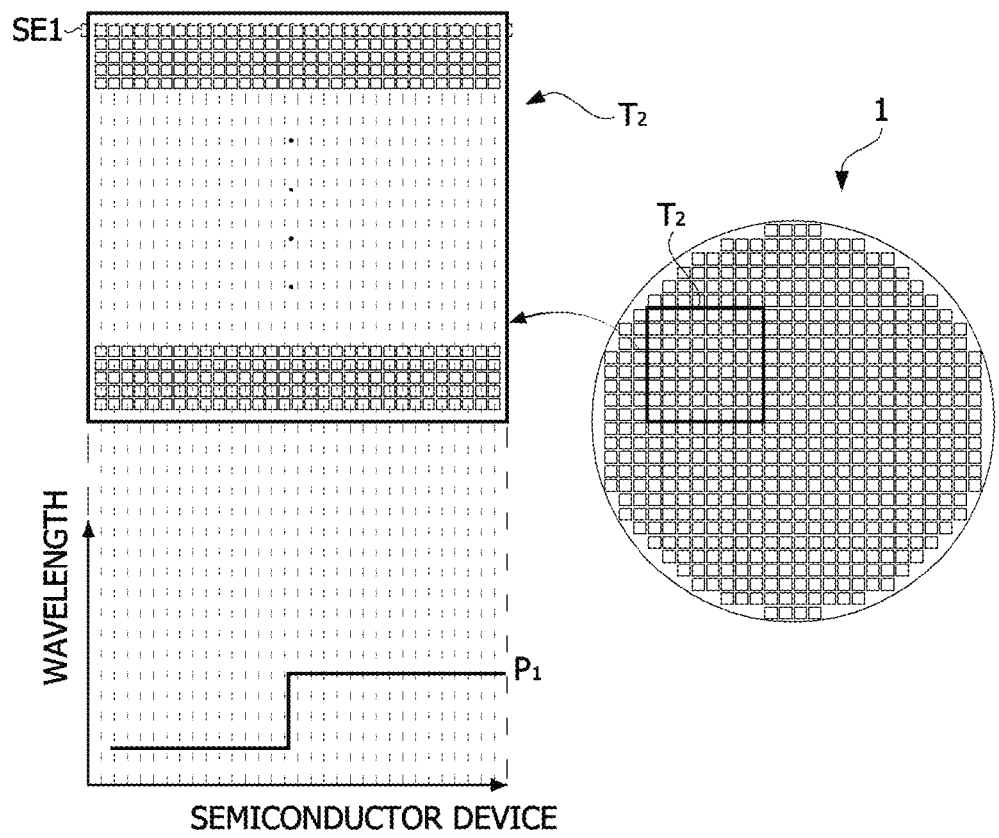

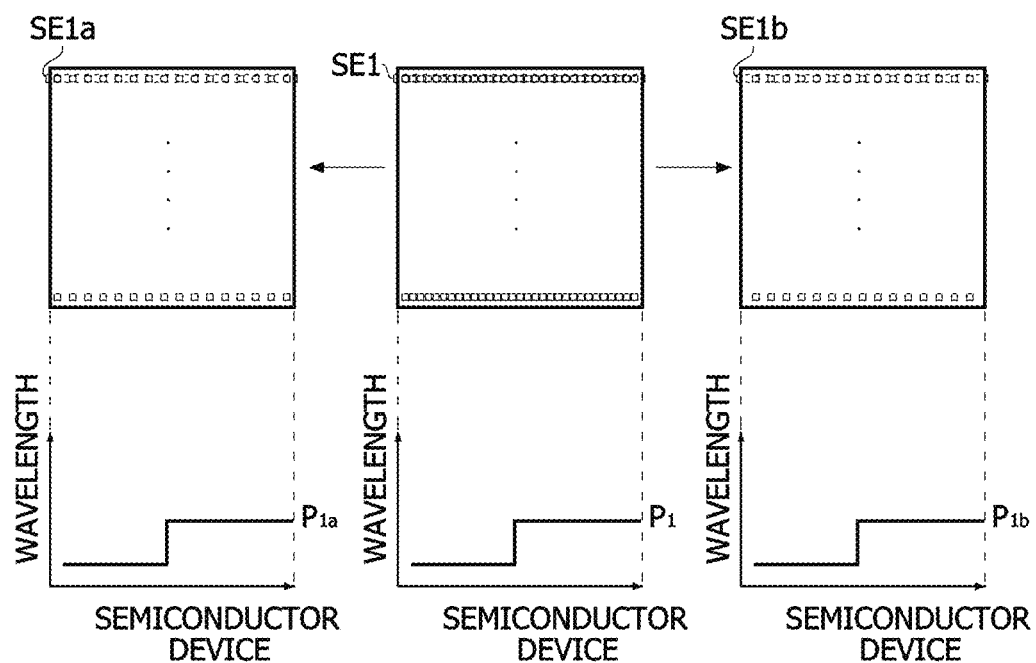
[FIG. 14B]

[FIG. 14C]
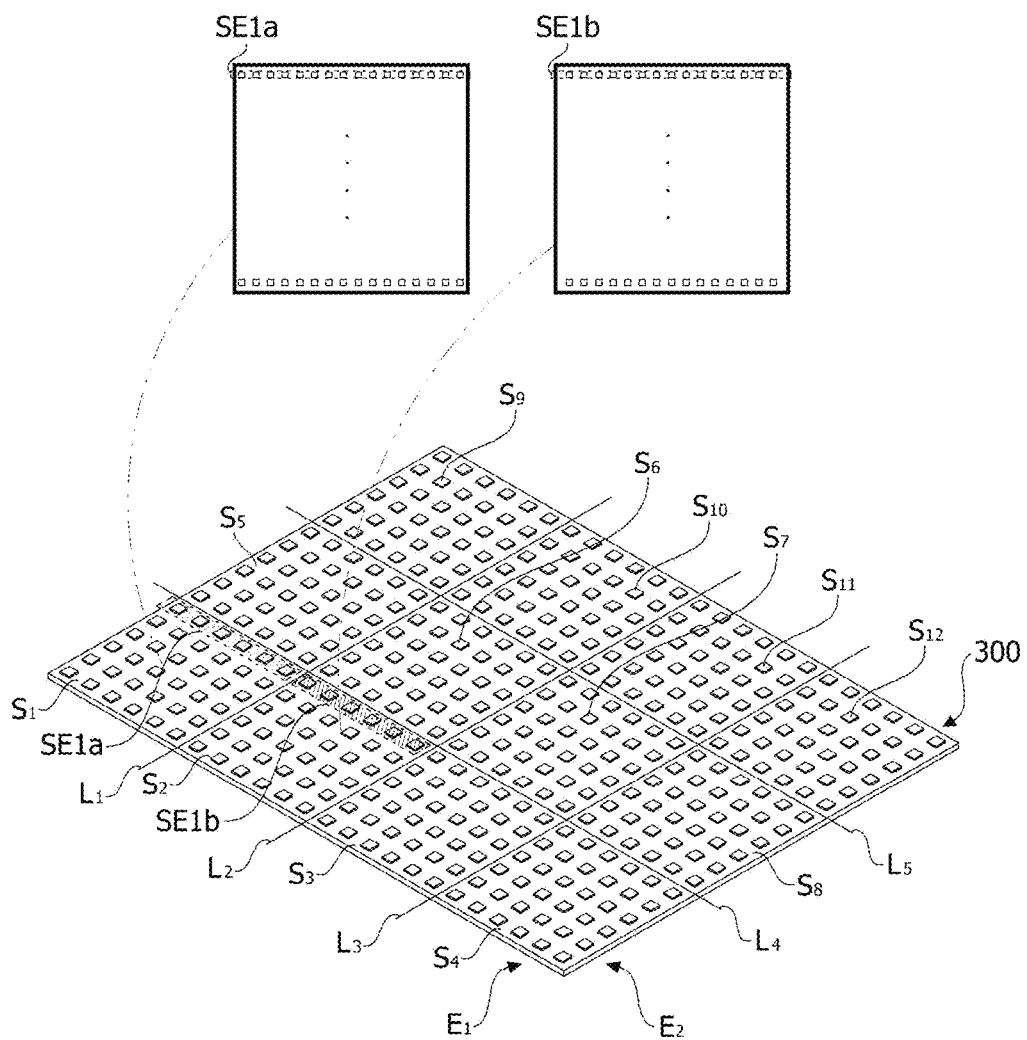

SEMICONDUCTOR MODULE AND DISPLAY DEVICE INCLUDING SAME

CROSS REFERENCE TO RELATED APPLICATIONS

This application is the National Phase of PCT/KR2018/011032 filed on Sep. 19, 2018, which claims priority under 35 U.S.C. § 119(a) to Patent Application No. 10-2017-0120541 filed in the Republic of Korea on Sep. 19, 2017, all of which are hereby expressly incorporated by reference into the present application.

TECHNICAL FIELD

Exemplary embodiments relate to a semiconductor module and a display device including the same.

BACKGROUND ART

Display devices are widely used as display screens of notebook computers, tablet computers, smart phones, portable display devices, portable information devices, and the like in addition to being used as display devices of televisions or monitors.

Liquid crystal displays and organic light-emitting displays display images using thin film transistors as switching elements. Since the liquid crystal display is not a self-emission type display, an image is displayed using light emitted from a backlight unit disposed below a liquid crystal display panel. Since the liquid crystal display has the backlight unit, there is a limitation in design and brightness and a response speed may be reduced. Since the organic light-emitting display includes an organic material, the organic light-emitting display is vulnerable to moisture, and thus reliability and service life thereof may be degraded.

Recently, research and development of a light-emitting diode display using a micro light-emitting device is underway, but there is a limit in color reproducibility that is degraded during production.

DISCLOSURE

Technical Problem

Embodiments are directed to providing a semiconductor module with improved wavelength distribution.

The embodiments are also directed to providing a display device having an improved wavelength deviation between a plurality of semiconductor modules.

The embodiments are also directed to providing a display device with improved color reproducibility.

Problems to be solved in the embodiments are not limited to the above-described problems, and objects and effects which can be determined from the solutions and the embodiments of the problems described below are also included.

Technical Solution

One aspect of the present invention provides a display device including a panel substrate, and a plurality of semiconductor devices disposed on the panel substrate, wherein the panel substrate includes a first region and a second region disposed in a first direction, the plurality of semiconductor devices include a plurality of first semiconductor devices disposed in the first region, and a plurality of second semiconductor devices disposed in the second region, a wavelength deviation between the first semiconductor devices disposed at an edge of the first region and the second semiconductor devices disposed at an edge of the second region is within 2 nm, and a first-first wavelength pattern of the plurality of first semiconductor which is the same as a first-second wavelength pattern of the plurality of second semiconductor devices.

The first region and the second region may be divided by an alignment mark.

A length of one side of each of the plurality of semiconductor devices may be less than or equal to 100 μm.

The plurality of first semiconductor devices may emit at least one among red light, green light, and blue light, and a wavelength deviation of the plurality of semiconductor devices emitting the red light disposed in the first region may be within 4 nm.

A wavelength deviation of the plurality of semiconductor devices emitting the green light disposed in the first region may be within 6 nm, and a wavelength deviation of the plurality of semiconductor devices emitting the red light disposed in the first region may be within 2 nm.

The plurality of second semiconductor devices may emit at least one among red light, green light, and blue light, and a wavelength deviation of the plurality of semiconductor devices emitting the red light disposed in the second region may be within 4 nm, a wavelength deviation of the plurality of semiconductor devices emitting the green light disposed in the second region may be within 6 nm, and a wavelength deviation of the plurality of semiconductor devices emitting the red light disposed in the second region may be within 2 nm.

Separation distances between first semiconductor devices emitting the same color among the plurality of first semiconductor devices may be the same.

The semiconductor device may include a first conductivity type semiconductor layer, a second conductivity type semiconductor layer, and an active layer disposed between the first conductivity type semiconductor layer and the second conductivity type semiconductor layer.

The first-first wavelength pattern and the first-second wavelength pattern may have the same increase or decrease of wavelengths in the same row or column.

The first-first wavelength pattern and the first-second wavelength pattern may have inflection points of the wavelengths at the same point.

The same point may be a region in which a row and a column are the same in the first region and the second region.

Advantageous Effects

According to embodiments, a semiconductor module having improved wavelength distribution can be implemented.

Further, a display device having an improved wavelength deviation between a plurality of semiconductor modules can be manufactured.

Further, a display device with improved color reproducibility can be manufactured.

Various beneficial advantages and effects of the present invention are not limited by the above description and should be easily understood through a description of a detailed embodiment of the present invention.

DESCRIPTION OF DRAWINGS

FIG. 1 is a conceptual diagram of a plurality of semiconductor devices disposed on a wafer according to an embodiment.

FIG. 2 is a cross-sectional view taken along line A-A' in FIG. 1.

FIG. 3 is a diagram for describing manufacture of semiconductor devices for reducing a wavelength deviation between the semiconductor devices on a wafer according to a first embodiment.

FIG. 4 is a diagram illustrating a wavelength distribution of the wafer manufactured according to the first embodiment in FIG. 3.

FIG. 5 is a diagram for describing manufacture of semiconductor devices for reducing a wavelength deviation between the semiconductor devices on a wafer according to a second embodiment.

FIG. 6 is a diagram illustrating a wavelength distribution of the wafer manufactured according to the first embodiment in FIG. 5.

FIGS. 7A and 7B are diagrams for describing a process of transferring semiconductor devices of a wafer to donor substrates.

FIGS. 8A and 8B are diagrams illustrating a manufacturing process in which semiconductor devices are transferred from a wafer to a donor substrate.

FIG. 9 is a conceptual diagram illustrating semiconductor devices on donor substrates that are transferred to a panel substrate of a display device.

FIGS. 10A and 10B are diagrams illustrating a process of transferring semiconductor devices to a panel substrate of a display device.

FIG. 11 is a conceptual diagram illustrating a semiconductor module and a panel substrate according to an embodiment.

FIG. 12 is a diagram illustrating an effect of a display device according to an embodiment.

FIGS. 13A to 13C are diagrams for describing a characteristic of a panel substrate according to one embodiment.

FIGS. 14A to 14C are diagrams for describing a characteristic of a panel substrate according to another embodiment.

MODES OF THE INVENTION

The present invention may be modified into various forms and may have a variety of embodiments, and, therefore, specific embodiments will be illustrated in the drawings and described. The embodiments, however, are not to be taken in a sense which limits the present invention to the specific embodiments and should be construed to include modifications, equivalents, or substituents within the spirit and technical scope of the present invention.

The terms including ordinal numbers such as first, second, and the like used herein may be used to describe various components, but the various components are not limited by the terms. The terms are used only for the purpose of distinguishing one component from another component. For example, without departing from the scope of the present invention, a second component may be referred to as a first component, and similarly, a first component may also be referred to as a second component. The term "and/or" includes a combination of a plurality of related listed items or any one item of the plurality of related listed items.

When a component is referred to as being "connected" or "coupled" to another component, it may be directly connected or coupled to another component, but it should be understood that still another component may exist between the component and another component. Contrarily, when a component is referred to as being "directly connected," or "directly coupled" to another component, it should be understood that still another component may be absent between the component and another component.

The terms used herein are employed to describe only specific embodiments and are not intended to limit the present invention. Unless the context clearly dictates otherwise, the singular form includes the plural form. It should be understood that the terms "comprise," "include," and "have" specify the presence of stated herein features, numbers, steps, operations, components, elements, or combinations thereof, but do not preclude the presence or possibility of adding one or more other features, numbers, steps, operations, components, elements, or combinations thereof.

Unless otherwise defined, all terms including technical or scientific terms used herein have the same meaning as commonly understood by those skilled in the art to which the present invention pertains. General terms that are defined in a dictionary shall be construed as having meanings that are consistent in the context of the relevant art and are not to be interpreted as having an idealistic or excessively formalistic meaning unless clearly defined in the present application.

Hereinafter, embodiments of the present invention will be described in detail with reference to the drawings, the same reference numerals are given to the same or corresponding components regardless of a number of the drawing, and a repetitive description thereof will be omitted.

FIG. 1 is a conceptual diagram of a plurality of semiconductor devices disposed on a wafer according to an embodiment, and FIG. 2 is a cross-sectional view taken along line A-A' in FIG. 1.

Referring to FIG. 1, a plurality of semiconductor devices 10 may be disposed on a wafer 1.

The wafer 1 may include a region in which the plurality of semiconductor devices 10 are disposed and scribe lane regions SL. For example, the region in which the semiconductor devices 10 are disposed may be a chip region. Further, the scribe lane region SL may mean a region in which a surface of the semiconductor wafer 1 is vertically and horizontally recessed using a diamond cutter or the like so that the semiconductor wafer 1 is separated into a plurality of chips. Further, the scribed semiconductor wafer 1 may be separated into a plurality of chips by rolling a roller, but the present invention is not limited thereto.

As described above, referring to FIG. 2, the plurality of semiconductor devices 10 may be disposed on the wafer 1. The semiconductor devices 10 according to the present embodiment may be disposed on a substrate 110.

The substrate 110 may be formed of a material selected from sapphire ($Al_2O_3$), SiC, GaAs, GaN, ZnO, Si, GaP, InP, and Ge. Further, the substrate 110 may be a rigid substrate 110 such as a silicon substrate 110, a silicon-on-insulator (SOI) substrate 110, a gallium arsenide substrate 110, a silicon germanium substrate 110, a ceramic substrate 110, a quartz substrate 110, or a glass substrate 110 for a display or may be a flexible plastic substrate 110 made of polyimide, polyester, polycarbonate, polyethersulfone, polymethylmethacrylate, polyethylene naphthalate, polyethyleneterephthalate, or the like, but the present invention is not limited to the above materials.

The substrate 110 may include scribe lane regions and chip regions. The substrate 110 may be a first conductivity type (e.g., N-type) substrate 110. In this case, an epi-layer of a first conductivity type (e.g., N-type) may be grown on the substrate 110. Further, the semiconductor device 10 may be formed by etching the grown epi-layer and forming an electrode and the like.

The semiconductor device 10 according to the present embodiment may include a first conductivity type semiconductor layer 11 disposed on the substrate 110, an active layer 12 disposed on the first conductivity type semiconductor layer 11, a second conductivity type semiconductor layer 13 disposed on the active layer 12, a first electrode 14 electrically connected to the first conductivity type semiconductor layer 11, and a second electrode 15 electrically connected to the second conductivity type semiconductor layer 13. Additionally, the semiconductor device 10 may further include an insulating layer 16 disposed to surround the first conductivity type semiconductor layer 11, the active layer 12, and the second conductivity type semiconductor layer 13.

First, the first conductivity type semiconductor layer 11 may be formed of a compound semiconductor of a Group III-V or II-VI and doped with a first dopant. The first conductivity type semiconductor layer 11 may be formed of a semiconductor material having a composition formula of $In_{x1}Al_{y1}Ga_{1-x1-y1}N$ ($0 \le x1 \le 1$, $0 \le y1 \le 1$, and $0 \le x1+y1 \le 1$) and selected from among, e.g., GaN, AlGaN, InGaN, InAlGaN, and the like. Further, the first dopant may be an n-type dopant such as Si, Ge, Sn, Se, or Te. When the first dopant is an n-type dopant, the first conductivity type semiconductor layer 11 doped with the first dopant may be an n-type semiconductor layer.

The active layer 12 may be disposed on the first conductivity type semiconductor layer 11. Further, the active layer 12 is disposed between the first conductivity type semiconductor layer 11 and the second conductivity type semiconductor layer 13.

The active layer 12 is a layer in which electrons (or holes) implanted through the first conductivity type semiconductor layer 11 and holes (or electrons) implanted through the second conductivity type semiconductor layer 13 recombine. The active layer 12 may transitioned to a low energy level due to recombination of electrons and holes and emit light having a wavelength corresponding to the transition.

The active layer 12 may have any one among a single well structure, a multi-well structure, a single quantum well structure, a multi quantum well (MQW) structure, a quantum dot structure, and a quantum wire structure, but a structure of the active layer 12 is not limited thereto. The active layer 12 may include aluminum (Al).

The second conductivity type semiconductor layer 13 may be disposed on the active layer 12. The second conductivity type semiconductor layer 13 may be formed on the active layer 12, may be formed of a compound semiconductor of a group III-V or II-VI, and may be doped with a second dopant. The second conductivity type semiconductor layer 13 may be formed of a semiconductor material having a composition formula of $In_{x5}Al_{y2}Ga_{1-x5-y2}N$ ($0 \le x5 \le 1$, $0 \le y2 \le 1$, and $0 \le x5+y2 \le 1$) or formed of a material selected from among AlInN, AlGaAs, GaP, GaAs, GaAsP, and AlGaInP. When the second dopant is a p-type dopant such as Mg, Zn, Ca, Sr, or Ba, the second conductivity type semiconductor layer 13 doped with the second dopant may be a p-type semiconductor layer.

The first electrode 14 may be disposed on the first conductivity type semiconductor layer 11. The first electrode 14 may be electrically connected to the first conductivity type semiconductor layer 11. The second electrode 15 may be disposed on the second conductivity type semiconductor layer 13. The second electrode 15 may be electrically connected to the second conductivity type semiconductor layer 13.

The first electrode 14 and the second electrode 15 may be formed of indium tin oxide (ITO), indium zinc oxide (IZO), indium zinc oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, and Ni/$IrO_x$/Au, or Ni/$IrO_x$/Au/ITO, Ag, Ni, Cr, Ti, Al, Rh, Pd, Ir, Sn, In, Ru, Mg, Zn, Pt, Au, and Hf. However, the present invention is not limited to these materials.

Further, the insulating layer 16 may cover the semiconductor device 10 to electrically insulate the first electrode 14 from the second electrode 15.

With the above configuration, the semiconductor device 10 according to the embodiment may emit light when electricity is supplied from the first electrode 14 and the second electrode 15. The semiconductor device 10 according to the embodiment may provide red light, blue light, or green light. Alternatively, the semiconductor device 10 according to the embodiment may provide all of the red light, the blue light, and the green light. That is, the semiconductor device 10 may provide light of various colors as a single light or multiple lights.

FIG. 3 is a diagram for describing manufacture of semiconductor devices for reducing a wavelength deviation between the semiconductor devices on a wafer according to a first embodiment.

Referring to FIG. 3, a wafer manufacturing apparatus may include a rotating plate including an accommodation part, in which a wafer is disposed, and a main plate 21 for supporting the rotating plate.

The main plate 21 may be a circular-shaped plate having a predetermined area and may be rotated. A heater may be disposed in an outer side of the main plate 21 to transfer heat to the main plate 21. Any structure of a general susceptor may be applied to the main plate 21.

A plurality of rotating plates 22 may be provided. For example, the rotating plate 22 may include a first rotating plate 22-1, a second rotating plate 22-2, a third rotating plate 22-3, and a fourth rotating plate 22-4. Further, the plurality of rotating plates 22 may be disposed on the main plate to be rotated independently. The rotating plate 22 may receive heat from a heater through the main plate.

In this case, the above-described semiconductor device may be manufactured such that a wafer is disposed on the rotating plate 22. Further, a light emission wavelength of the semiconductor device may be varied due to compositions and thicknesses of the first conductivity type semiconductor layer, the active layer, and the second conductivity type semiconductor layer. In this case, the compositions may be significantly changed due to a temperature.

Therefore, when the semiconductor device according to the present embodiment is manufactured, it is possible to match a shape of the wafer to that of the rotating plate 22 supporting the wafer. Further, the wafer may be rotated by a rotation of the main plate and, simultaneously, rotated by a rotation of the rotating plate. Thus, a temperature may be uniform on the wafer. Accordingly, the compositions of the first conductivity type semiconductor layer, the active layer, and the second conductivity type semiconductor layer of the semiconductor device disposed on the wafer may become uniform. Further, a wavelength difference between the plurality of semiconductor devices which are disposed on the wafer and emit light may be reduced.

FIG. 4 is a diagram illustrating a wavelength distribution of the wafer manufactured according to the first embodiment in FIG. 3.

Referring to FIG. 4, the semiconductor devices on the wafer may provide green light. Thus, it is confirmed that a difference in peak wavelength between the semiconductor devices is less than or equal to 6 nm. Here, the difference in peak wavelength means a difference between maximum wavelengths and minimum wavelengths among light wavelengths of the plurality of semiconductor devices. Hereinafter, a wavelength deviation may be half of the difference in peak wavelength.

FIG. 5 is a diagram for describing manufacture of semiconductor devices for reducing a wavelength deviation between the semiconductor devices on a wafer according to a second embodiment, and FIG. 6 is a diagram illustrating a wavelength distribution of the wafer manufactured according to the first embodiment in FIG. 5.

As described above with reference to FIG. 3, referring to FIG. 5, the wafer manufacturing apparatus may include a chamber, a sealing 39, a gas sprayer 38, a main plate 37, a rotating shaft 36, an inner gear 34, an outer gear 35, a wafer holder 32, a holder pin 33, and a carbon plate 40.

The chamber (not shown) may include an inner accommodation space in which a process of depositing an epi-layer is performed. The chamber (not shown) may include an opening which is open and which is provided at an upper portion of the chamber for loading and unloading of the wafer.

Generally, since a process in the chamber (not shown) is performed at a high temperature, the chamber may include various materials and various shapes which are capable of withstanding the high temperature.

The chamber (not shown) may include a gas outlet (not shown) for discharging a process gas after a process is completed. The gas outlet (not shown) may extend from an interior of the chamber (not shown) to an exterior of the chamber (not shown) by passing through a side surface or a bottom surface of the chamber.

The gas outlet (not shown) may be disposed on each of one side surface and the other side surface of the chamber (not shown) but is not limited to these positions.

The chamber (not shown) may include a pressure adjuster for adjusting an internal pressure. Thus, the interior of the chamber (not shown) may become a vacuum state. The above pressure regulation may be performed by a vacuum pump, a pressure sensor, a plurality of valves, or the like, but the present invention is not limited thereto.

The sealing 39 may be formed using a material having excellent durability against a high temperature. The sealing 39 may generally be formed of graphite coated with tantalum carbide (TaC), but a problem of delamination occurs at a high temperature, and thus the sealing 39 may be formed through various methods according to an environment.

The gas sprayer 38 may spray various process gases into the chamber. In particular, the gas sprayer 38 may supply a process gas which reacts with a wafer to grow a desired epi-layer. The gas sprayer 38 may be disposed to pass through the sealing 39.

One side of the gas sprayer 38 may be connected to a gas supplier (not shown) disposed outside the chamber. One side of the gas sprayer 38 may be disposed in an inner space of the chamber.

The gas sprayer 38 may spray a process gas by receiving the process gas from the gas supplier. Thus, the sprayed process gas may move toward the wafer in a direction S.

The gas supplier may include a container in which a process gas is stored, a flow rate sensor, a flow rate control valve, and the like. The process gas may include a growth gas which is a source of an epitaxial growth and a doping gas for performing doping in the growth process, but the present invention is not limited thereto, and the process gas may be variously changed according to the epitaxial growth.

The main plate 37 may be a circular-shaped plate having a predetermined area and may be rotated. A heater 31 may be disposed on an outer side of the main plate 37 to transfer heat to the main plate 37. Any structure of a general susceptor may be applied to the main plate 37. The main plate 37 may be disposed to face the gas sprayer 38.

The main plate 37 may be connected to the rotating shaft 36 to be rotated. The rotating shaft 36 may rotate the main plate 37 by receiving an external rotating force.

The wafer holder 32 for accommodating the wafer 1 may be disposed on the main plate 37. The wafer holder 32 may be rotated as the above-described rotating plate shown in FIG. 3. To this end, the inner gear 34 may be disposed near the wafer holder 32 with respect to the rotating shaft 36 and connected to the wafer holder 32. The outer gear 35 may be disposed far from the wafer holder 32 with respect to the rotating shaft 36 and connected to the wafer holder 32.

The wafer holder 32 may accommodate the wafer 1 therein and may be disposed between the inner gear 34 and the outer gear 35.

The wafer holder 32 may include the holder pin 33 for fixing the wafer 1. The holder pin 33 may be disposed on an upper surface of the wafer 1. Here, the upper surface of the wafer 1 may be a surface of the wafer 1 coming into contact with a gas discharged from the gas sprayer 38.

Further, the holder pins 33 may be disposed in some portions of the upper surface of the wafer 1 to hinder formation of the semiconductor devices on the wafer 1. For example, semiconductor devices disposed in the region in which the holder pins 33 are disposed among the plurality of semiconductor devices disposed on the wafer 1 may not generate light having a desired wavelength, and thus a wavelength deviation may be increased. Thus, in order to reduce the deviation between semiconductor devices, manufacture of the semiconductor devices according to a second embodiment may be performed by adjusting positions and the number of the holder pins 33.

The holder pin 33 may be disposed in a region in which the semiconductor device disposed on the wafer 1 is not transferred to the donor substrate. For example, the holder pin 33 may be formed such that a size of the holder pin 33 is decreased so that a semiconductor device region from which the semiconductor devices on the wafer 1 are transferred to the donor substrate does not overlap a region in which the holder pin 33 is disposed on the wafer 1.

Further, the carbon plate 40 may be disposed in the wafer holder 32 to support the wafer 1.

Referring to FIG. 6, unlike yellow light emitted from a central portion CE of the wafer, light emitted from a region B in which the holder pin is disposed on the wafer has a violet color. As described above, it is confirmed that a difference in wavelength between light wavelengths of semiconductor devices in the region B in which the holder pin is disposed and light wavelengths of semiconductor devices in the central portion CE of the wafer is greater than or equal to 10 nm. In contrast, it is confirmed that a difference in wavelength between light wavelengths of semiconductor devices in a region C from which the holder pin is removed and the light wavelengths of the semiconductor devices in the central portion CE of the wafer is less than or equal to 2 nm. Thus, the holder pin is removed so that a difference in wavelength between a plurality of semiconductor devices disposed in a transfer region T in which transfer is made from the wafer to the donor substrate may be reduced. Further, as described above, the region B in which the holder pin is disposed is disposed to not overlap the transfer region T so that a difference in wavelength between the plurality of semiconductor devices disposed in the transfer region T may be reduced.

FIGS. 7A and 7B are diagrams for describing a process of transferring semiconductor devices of a wafer to donor substrates, and FIGS. 8A and 8B are diagrams illustrating a manufacturing process in which semiconductor devices are transferred from a wafer to donor substrate.

As described above, referring to FIGS. 7A and 7B, the plurality of semiconductor devices 10 disposed on the wafer 1 may be primarily transferred to a plurality of donor substrates 210.

In FIGS. 7A and 7B, a size of the wafer 1 may be six inches, but the present invention is not limited thereto. Each of the semiconductor devices 10 may have a size of 21 µm×45 µm.

In FIG. 7A, the plurality of semiconductor devices 10 may be disposed within a first width W1. Further, the plurality of semiconductor devices 10 may be disposed within a second width W2. The first width W1 may be a length in one direction in which the plurality of semiconductor devices are disposed, and the second width W2 may be a length in a direction perpendicular to the one direction. For example, the first width W1 may be a longitudinal length on the wafer 1, and the second width W2 may be a transverse length on the wafer 1. However, the present invention is not limited thereto.

Alternatively, the first width W1 and the second width W2 may be the same length. The first width W1 and the second width W2 may be arrangement intervals between a plurality of semiconductor devices disposed on a panel substrate which will be described below. For example, each of the first width W1 and the second width W2 may be 834 µm and varied according to intervals of the semiconductor devices disposed on the panel substrate.

As described above, in FIG. 7B, semiconductor devices 10 disposed in a predetermined region K of the wafer 1 may be transferred to the donor substrate 210. The predetermined region K may have the same size as the donor substrate 210. The plurality of semiconductor devices 10 disposed in the predetermined region K at predetermined intervals may be transferred to the donor substrate 210. Here, the donor substrate 210 and the plurality of semiconductor devices 10 disposed on the donor substrate 210 will be collectively referred to as a semiconductor module.

Further, the number of donor substrates 210 produced from one wafer 1 may be varied according to sizes of the wafer 1 and the donor substrate 210. For example, when a size of the wafer 1 is a six inch wafer, 5.4 million semiconductor devices may be disposed on the wafer 1. Further, when the donor substrate 210 has a size of 100.8 mm×100.8 mm, 375 donor substrates 210 may be produced per one wafer 1. However, as described above, the number of donor substrates may be variously changed according to the size of the wafer and the size of the donor substrate.

Further, the donor substrate 210 may have a third width W3 which is the above-described length in the one direction and a fourth width W4 which is a length in a direction different from the one direction. Here, the third width W3 and the fourth width W4 may be the same length. In this case, as described below, when the donor substrate 210 is transferred to the panel substrate, the panel substrate may include the same size regions having the same wavelength pattern. Further, a difference in wavelength between semiconductor devices of the same color at edges between the same size regions of the panel substrate may be less than or equal to a predetermined value.

Further, the plurality of semiconductor devices 10 disposed on the wafer 1 may be transferred to the donor substrate 210 in a state of being disposed to be spaced by a predetermined distance in the one direction and the direction different from the one direction. For example, as described above, 14,400 semiconductor devices among the 5.4 million semiconductor devices disposed on the wafer 1 may be transferred to the donor substrate 210. Accordingly, the semiconductor devices disposed on the donor substrate 210 may be spaced apart from each other. Further, a separation distance between the semiconductor devices disposed on the wafer 1 may be different from a separation distance between the semiconductor devices disposed on the donor substrate 210. For example, the separation distance between the semiconductor devices disposed on the wafer 1 may be smaller than the separation distance between the semiconductor devices disposed on the donor substrate 210. Accordingly, as described below, a plurality of semiconductor devices disposed in the same region on the wafer 1 may be transferred to the panel substrate to have predetermined intervals through the donor substrate 210. Thus, the plurality of semiconductor devices transferred to the panel substrate may provide the same characteristics, such as a wavelength change and the like, of the semiconductor devices disposed in the same region of the wafer.

Further, the plurality of semiconductor devices 10 disposed on the donor substrate 210 may provide red light R, green light G, and blue light B. In FIGS. 7A and 7B, the semiconductor devices 10 may be seen as a single chip, but the present invention is not limited thereto, and semiconductor devices provided with red, green, and blue light may be formed as one semiconductor device 10. Further, the semiconductor devices 10 may be designed in the form of a single chip to provide all the red, green, and blue light. Hereinafter, the semiconductor devices will be described based on a case in which the semiconductor devices are designed in the form of a single chip and designed to provide a single color.

Referring to FIGS. 8A and 8B, the substrate and the plurality of semiconductor devices which are disposed on the wafer may be transferred to the donor substrate (hereinafter, referred to as "primary transfer").

Referring to FIG. 8A, one or more semiconductor devices selected among the plurality of semiconductor devices 10-1, 10-2, 10-3, and 10-4 may be separated from the substrate 110 using the donor substrate 210. The donor substrate 210 may include a carrier frame 212 and a first bonding layer 211 which is disposed therebelow. For example, the carrier frame 212 may have an irregular structure and may easily bond the semiconductor devices to the first bonding layer 211. However, the present invention is not limited thereto.

As described with reference to FIGS. 7A and 7B, only semiconductor devices disposed at a predetermined separation distance W5 among the plurality of semiconductor devices disposed on the wafer may be transferred to the donor substrate 210. Further, the separation distance W5 between the semiconductor devices transferred to the donor substrate may be the same as the first width W1 or the second width W2 which are described above. In this case, the separation distance W5 may be a distance between one sides of the semiconductor devices which are alternately disposed. For example, the separation distance W5 may be a distance from one side of the first semiconductor device 10-1 to that of the third semiconductor device 10-3. Hereinafter, a description will be made on the basis of the above description. However, the present invention is not limited thereto, and the separation distance W5 may be set as a minimum distance between the semiconductor devices which are alternately disposed or a distance between semiconductor devices having a predetermined number of semiconductor devices therebetween.

Referring to FIG. 8B, when the donor substrate 210 is moved upward after laser irradiation, the first semiconductor device 10-1 and the third semiconductor device 10-3 may be separated from the substrate 110. Specifically, the selected semiconductor devices 10-1 and 10-3 may be separated from the substrate 110 by irradiating a laser beam passing through the substrate 110 below the selected semiconductor devices 10-1 and 10-3. In this case, the donor substrate 210 is moved upward, and the selected semiconductor devices 10-1 and 10-3 may also be moved along the movement of the donor substrate 210.

For example, a lower portion of a region in which the first semiconductor device 10-1 and the third semiconductor device 10-3 are disposed on the substrate 110 is irradiated with a laser so that the first semiconductor device 10-1 and the third semiconductor device 10-3 may be separated from the substrate 110. The present invention is not limited thereto. Further, when one semiconductor device is separated at a time, the donor substrate 210 and the first bonding layer 211 may be formed to be bonded to the one semiconductor device.

For example, a laser lift-off (LLO) using a photon beam in a specific wavelength range may be applied to a method of separating the semiconductor devices from the substrate 110. For example, a central wavelength of the irradiated laser may be 266 nm, 532 nm, or 1064 nm, but the present invention is not limited thereto.

Further, the plurality of semiconductor devices separated from the substrate 110 may have a predetermined interval of separation from each other. As described above, the first semiconductor device 10-1 and the third semiconductor device 10-3 are separated from the substrate 110, and the second semiconductor device 10-2 and the fourth semiconductor device 10-4, which have the same separation distance as that between the first semiconductor device 10-1 and the third semiconductor device 10-3, may be separated in the same manner. Thus, the semiconductor devices having the same separation distance may be transferred to the display panel.

FIG. 9 is a conceptual diagram illustrating the semiconductor devices on the donor substrates that are transferred to a panel substrate of a display device, and FIGS. 10A and 10B are diagrams illustrating a process of transferring semiconductor devices to a panel substrate of a display device.

Referring to FIG. 9, the plurality of semiconductor devices 10 which are primarily transferred from the wafer 1 may be disposed on the donor substrate 210. Further, a plurality of donor substrates 210 to which the plurality of semiconductor devices 10 are transferred from the wafer 1 may be provided. Further, the plurality of semiconductor devices 10 disposed on the donor substrate 210 may be secondly transferred to a panel substrate 300. In this case, the panel substrate 300 may include a plurality of regions. Here, each of the regions formed on the panel substrate 300 is a region in which the semiconductor devices are transferred by being secondarily transferred from one donor substrate.

The panel substrate 300 may be a panel of the display device and have a quadrangular shape but may have one of various shapes. Hereinafter, a description will be made based on the quadrangular shape. Further, the panel substrate 300 may include twelve regions S1 to S12. For example, the panel substrate 300 may include a first region S1 to a twelfth region S12. Further, the first region S1 to the twelfth region S12 may be divided by a first line L to a fifth line L5. The first line L1 to the third line L3 may quadrisect a first surface E1 of the panel substrate 300. Further, the fourth line L4 to the fifth line L5 may trisect a second surface E2 of the panel substrate 300. Here, each of the first surface E1 and the second surface E2 may be any one among edges of the panel substrate 300. The first surface E1 and the second surface E2 may be adjacent to each other.

The first regions S1 to the twelfth region S12, which are separated as described above, may have the same size as the donor substrate 210. The first regions S1 to the twelfth region S12 may each include an alignment mark. Each of the above-described lines may correspond to the alignment mark, but the present invention is not limited thereto. The plurality of donor substrates 210 may be disposed in the first region S1 to the twelfth region S12 along the alignment marks included in the first regions S1 to twelfth region S12. Thus, the semiconductor devices 10 disposed on the donor substrate 210 may be semiconductor devices 10 manufactured in the same one region of the wafer 1. That is, the plurality of semiconductor devices disposed in each region may be transferred to correspond to the alignment mark. Accordingly, the semiconductor devices may be classified by whether they are transferred from the same donor substrate 210 through the alignment mark on the panel substrate. In other words, the alignment mark may be used to distinguish whether chips are transferred from the same wafer. However, the present invention is not limited thereto, and chips transferred from the same wafer may be distinguished using the alignment marks in various manners.

In the manufacturing process, the alignment mark may be identically formed for each region of the donor substrate 210 and the panel substrate, and the second transfer may be performed along the alignment mark during the process.

The plurality of semiconductor devices 10 disposed on the panel substrate 300 may have a predetermined separation distance d2. In this case, since the semiconductor devices 10 of the donor substrate 210 are transferred to the panel substrate 300 along the above-described alignment marks, the separation distance d1 of the plurality of semiconductor devices 10 disposed on the donor substrate 210 may be the same as the separation distance d2 of the plurality of semiconductor devices 10 disposed on the panel substrate 300. Further, the separation distance d2 between adjacent semiconductor devices 10 on the panel substrate 300 and the separation distance d1 between adjacent semiconductor devices 10 on the donor substrate 210 may be larger than a separation distance between a plurality of adjacent semiconductor devices disposed on the wafer 1. With such a configuration, the plurality of semiconductor devices 10 disposed in a predetermined region on the wafer 1 may be transferred to the plurality of donor substrates 210 at a predetermined distance. Further, the plurality of semiconductor devices 10 disposed in the predetermined region on the wafer 1 may be transferred to the panel substrate 300 through the donor substrates 210 at a predetermined distance.

Alternatively, in each of the donor substrates 210, some semiconductor devices may be transferred from a wafer including semiconductor devices emitting red light, some semiconductor devices may be transferred from a wafer including semiconductor devices emitting green light, and some semiconductor devices may be transferred from a wafer including semiconductor devices emitting blue light. Accordingly, all of the semiconductor devices generating red, green, and blue light may be disposed on one donor substrate 210. For example, on the donor substrate 210, semiconductor devices emitting red, green, and blue light may be sequentially disposed and adjacent semiconductor devices may be disposed to emit different light.

Specifically, referring to FIG. 10A, the semiconductor devices selected in FIG. 8B may be disposed on the panel substrate. For example, the first semiconductor device 10-1 and the third semiconductor device 10-3 may be disposed on the panel substrate 300. In this case, a second bonding layer 310 may be disposed on the panel substrate 300, and the first semiconductor device 10-1 and the third semiconductor device 10-3 may be disposed on the second bonding layer 310. Thus, the first semiconductor device 10-1 and the third semiconductor device 10-3 may be bonded to the second bonding layer. Through the above manner, semiconductor devices having a separation distance may be disposed on the panel substrate to improve efficiency of a transfer process.

Further, a laser may be irradiated to separate the first bonding layer 211 from the selected semiconductor devices. For example, an upper portion of the donor substrate 210 is irradiated with the laser so that the first bonding layer 211 may be physically separated from the selected semiconductor devices.

Referring to FIG. 10B, when the donor substrate 210 is moved upward after the laser irradiation, the first semiconductor device 10-1 and the third semiconductor device 10-3 may be separated from the donor substrate 210. The second bonding layer 310 may be bonded to the first semiconductor device 10-1 and the third semiconductor device 10-3. Consequently, the plurality of semiconductor devices on the donor substrate may be transferred to the panel substrate (secondary transfer).

FIG. 11 is a conceptual diagram illustrating a semiconductor module and a panel substrate according to an embodiment.

Referring to FIG. 11, a plurality of semiconductor modules according to the embodiment may be transferred to a panel substrate.

In this case, in the semiconductor module according to the embodiment, a wavelength deviation between the plurality of semiconductor devices which are disposed on an edge of the semiconductor module and emit blue light may be less than or equal to 2 nm. Further, in the semiconductor module according to the embodiment, a wavelength deviation between the plurality of semiconductor devices which are disposed on the edge of the semiconductor module and emit red light may be less than or equal to 4 nm. Further, in the semiconductor module according to the embodiment, a wavelength deviation between the plurality of semiconductor devices which are disposed on the edge of the semiconductor module and emit green light may be less than or equal to 6 nm. This is because the plurality of semiconductor devices disposed on one wafer are transferred to the donor substrate according to the method described with reference to FIGS. 3 and 5 so that the wavelength deviation between the semiconductor devices is improved.

Further, the semiconductor module transferred to the first region S1 of the panel substrate may include a first edge region M1. Here, an edge region is referred to as a region including the plurality of semiconductor devices disposed at an outermost side of each of the semiconductor modules.

The semiconductor module transferred to the second region S2 of the panel substrate may include a second edge region M2. Further, the semiconductor module transferred to the fifth region S5 of the panel substrate may include a third edge region M3. Further, the semiconductor module transferred to the sixth region S6 of the panel substrate may include a fourth edge region M4.

Here, the first edge region M1 may include a first-first edge region M11 to a first-fourth edge region M14. Further, the second edge region M2 may include a second-first edge region M21 to a second-fourth edge region M24. The third edge region M3 may include a third-first edge region M31 to a third-fourth edge region M34. The fourth edge region M4 may include a fourth-first edge region M41 to a fourth-fourth edge region M44.

As described above, in the plurality of semiconductor devices disposed in each of the first edge region M1 to the fourth edge region M4, the wavelength deviation of each of the blue light, the red light, and the green light is less than or equal to 2 nm, 4 nm, and 6 nm.

Further, an edge region of another region adjacent to the first-first edge region M11 may be a third-third edge region M33. In this case, when a wavelength deviation of the plurality of semiconductor devices disposed in the edge region of each of the first to fourth regions is less than or equal to 2 nm (blue light), a wavelength deviation in adjacent edge regions between adjacent different semiconductor modules may be less than or equal to 2 nm. Therefore, color reproducibility of the panel substrate of the display device manufactured with the plurality of semiconductor modules may be significantly improved. As described above, this is because the plurality of donor substrates primarily transferred from the same wafer are secondarily transferred to the panel substrate.

For example, a wavelength deviation between the blue light of the semiconductor devices disposed in the first-first edge region M11 and the blue light of the semiconductor devices disposed in the third-third edge region M33 may be less than or equal to 2 nm. Further, a wavelength deviation between the red light of the semiconductor devices disposed in the first-first edge region M11 and the red light of the semiconductor devices disposed in the third-third edge region M33 may be less than or equal to 4 nm, and a wavelength deviation between the green light of the semiconductor devices disposed in the first-first edge region M11 and the green light of the semiconductor devices disposed in the third-third edge region M33 may be less than or equal to 6 nm.

In addition, a wavelength deviation between the semiconductor devices disposed in the first-fourth edge region M14 and semiconductor devices disposed in a second-second edge region M22 may be applied in the same manner. Further, a wavelength deviation between the semiconductor devices disposed in the second-first edge region M21 and semiconductor device disposed in a fourth-third edge region M43 may be applied in the same manner, and a wavelength deviation between the semiconductor devices disposed in the third-fourth edge region M34 and semiconductor devices disposed in a fourth-second edge region M42 may also be applied in the same manner. That is, peak wavelength differences with respect to the colored light of the semiconductor devices disposed between adjacent edge regions in each of the first to fourth regions may be maintained to be less than or equal to the above-described values. Thus, even when the plurality of semiconductor modules are transferred to the panel substrate, light wavelength differences between the semiconductor devices may be reduced at boundary positions between regions in which the plurality of modules are disposed.

FIG. 12 is a diagram illustrating an effect of a display device according to an embodiment. As described above, referring to FIG. 12, FIGS. 12A to 12C illustrate a display device in which the semiconductor devices are disposed at the edge regions between the semiconductor modules and emit light having a wavelength difference that is larger than 4 nm (red light), 6 nm (green light), and 2 nm (blue light), and FIGS. 12D to 12F illustrate a display device in which the semiconductor devices are disposed at the edge regions between the semiconductor modules and emit light having a wavelength difference that is less than or equal to 4 nm (red light), 6 nm (green light), and 2 nm (blue light).

As shown in FIG. 9, referring to FIG. 12A, each region may be divided by a first line L1a to a fifth lines L5a. This may be equally applied to FIGS. 12B to 12F. Further, owing to a light wavelength deviation between the semiconductor devices between regions divided by each line, a division for each region is clearly exhibited. This is exhibited equally in FIGS. 12B and 12C.

In contrast, in the case of FIGS. 12D to 12F, the division for each region is not clearly exhibited, and thus it is difficult to visually distinguish each region. That is, color reproducibility of the display device according to the embodiment is improved.

FIGS. 13A to 13C are diagrams for describing a characteristic of a panel substrate according to one embodiment.

As described above, referring to FIG. 13A, a plurality of semiconductor devices may be disposed on the wafer 1. The plurality of semiconductor devices may emit light having a different wavelength according to various environments such as a growth condition and the like. Accordingly, the wafer 1 may include a plurality of regions including semiconductor devices emitting light having the same wavelength.

For example, the wafer may include a thirteenth region S13, a fourteenth region S14, a fifteenth region S15, and a sixteenth region S16. Further, the thirteenth region S13 may include the semiconductor devices having a first wavelength. Further, the fourteenth region S14 may include the semiconductor devices having a second wavelength, the fifteenth region S15 may include the semiconductor devices having a third wavelength, and the sixteenth region S16 may include the semiconductor devices having a fourth wavelength.

Further, the wavelength may be increased in the order of the first wavelength, the second wavelength, the third wavelength, and the fourth wavelength, but the present invention is not limited thereto. Alternatively, the first wavelength, the second wavelength, the third wavelength, and the fourth wavelength may include a single wavelength or a wavelength range.

Further, as described above, a plurality of semiconductor devices disposed in a first transfer region T1 on the wafer 1 may be transferred to a plurality of donor substrates. The first transfer region T1 may include a fourteenth-first region S14-1 that is a portion of the fourteenth region S14. Further, the first transfer region T1 may include a sixteenth-first region S16-1 that is a portion of the sixteenth region S16.

As described above, referring to FIG. 13B, the plurality of semiconductor devices disposed in the first transfer region T1 may be transferred to the plurality of donor substrates while maintaining a predetermined distance. Here, as described above, the predetermined distance may have the same distance as the separation distance between the semiconductor devices transferred to the panel substrate.

Further, each shape of the sixteenth-first region S16-1 and the fourteenth-first region S14-1 of the first transfer region T1 may be equally maintained on the plurality of donor substrates to which the semiconductor devices are transferred. For example, in the first transfer region T1, the semiconductor devices may be transferred to four donor substrates while maintaining a separation distance with respect to adjacent semiconductor devices.

In this case, the fourteenth-first region S14-1 of the first transfer region T1 may be provided as a fourteenth-2a region S14-2a, a fourteenth-2b region S14-2b, and a fourteenth-2c region S14-2c and a fourteenth-2d region S14-2d on the plurality of donor substrates. Further, the sixteenth-first region S16-1 of the first transfer region T1 may be provided as a sixteenth-2a region S16-2a, a sixteenth-2b region S16-2b, a sixteenth-2c region S16-2c, and a sixteenth-2d region S16-2d on the plurality of donor substrates.

Therefore, as described above, the plurality of donor substrates to which the semiconductor devices in the first transfer region T1 are transferred may include some of regions having the same form as the region for each wavelength of the first transfer region T1.

Further, the plurality of donor substrates to which the semiconductor devices are transferred from the first transfer region T1 may have the same number of semiconductor devices having the same wavelength. For example, in the sixteenth-2a region S16-2a and the sixteenth-2c region S16-2c, the semiconductor devices may be divided into semiconductor devices having the first wavelength and semiconductor devices having the third wavelength, and the number of the semiconductor devices and a positional relationship thereof may also be the same. For example, regions of the semiconductor devices having the first wavelength or the third wavelength may be the same in the sixteenth-2a region S16-2a and the sixteenth-2c region S16-2c.

As described above, referring to FIG. 13C, the semiconductor devices of the plurality of donor substrates may be transferred to the panel substrate 300. The panel substrate 300 may include a plurality of regions having the same shape as the divided regions according to the wavelengths of the semiconductor devices. For example, when the panel substrate 300 includes only a plurality of donor substrates transferred from one region of the wafer, the panel substrate 300 may include only a plurality of regions having the same shape as the divided regions according to the wavelengths. However, the present invention is not limited thereto, and, in the panel substrate 300, the plurality of regions having the same shape as the divided region according to the wavelengths may be present as some regions of the panel substrate 300.

FIGS. 14A to 14C are diagrams for describing a characteristic of a panel substrate according to another embodiment.

As described above, referring to FIG. 14A, a plurality of semiconductor devices may be disposed on the wafer 1. The plurality of semiconductor devices may emit light having a different wavelength according to various environments such as a growth condition and the like. Thus, the plurality of semiconductor devices disposed on the wafer 1 may have a plurality of rows in one direction. Further, the plurality of semiconductor devices disposed in each row may have a wavelength pattern in the one direction. Hereinafter, the wavelength pattern may be a curved line connecting wavelengths of the semiconductor devices disposed in each row in a row direction.

Further, as described above, a plurality of semiconductor devices disposed in a second transfer region T2 on the wafer 1 may be transferred to a plurality of donor substrates. In this case, a description will be made below based on a case in which semiconductor devices having the same colored light are transferred to each of the donor substrates. The second transfer region T2 may include a plurality of semiconductor devices. Further, in the second transfer region T2, the plurality of semiconductor devices may have a plurality of columns and rows. Hereinafter, as described above, a description will be made based on the row.

In the second transfer region T2, the plurality of semiconductor devices may be divided into a plurality of rows. For example, a row disposed on one edge may be a first row SE1. Further, semiconductor devices disposed in the first row SE1 may have a first wavelength pattern P1. Here, as described above, the first wavelength pattern P1 may be varied according to a growth environment and the like of the semiconductor devices. For example, all wavelength patterns of the rows may be different or the same, but the present invention is not limited thereto.

As described above, referring to FIG. 14B, the plurality of semiconductor devices disposed in the second transfer region T2 may be transferred to the plurality of donor substrates while maintaining a predetermined distance from each other. Here, as described above, the predetermined distance may have the same distance as the separation distance between the semiconductor devices transferred to the panel substrate.

Further, the first wavelength pattern P1 of the second transfer region T2 may be the same in each of the plurality of donor substrates to which the semiconductor devices are transferred. For example, in the second transfer region T2, the semiconductor devices may be transferred to two donor substrates while maintaining a separation distance with respect to adjacent semiconductor devices.

In this case, the first row SE1 of the second transfer region T2 may be transferred as a first-first row SE1$a$ and a first-second row SE1$b$ on the plurality of donor substrates. Therefore, as described above, the plurality of donor substrates to which the semiconductor devices are transferred from the first transfer region T2 may include wavelength patterns which are the same as the first wavelength pattern P1 of the second transfer region T2.

Further, curve lines connecting the wavelengths of the semiconductor devices disposed in the row direction in the first-first row SE1$a$ and the first-second row SE1$b$ may coincide with each other. That is, the semiconductor devices disposed in the row direction in the first-first row SE1$a$ may have a first-first wavelength pattern P1$a$. Further, the semiconductor devices disposed in the row direction in the first-second row SE1$b$ may have a first-second wavelength pattern P1$b$. The first-first wavelength pattern P1$a$ may be the same as the first-second wavelength pattern P1$b$. For example, the first-first wavelength pattern P1$a$ and the first-second wavelength pattern P1$b$ may have the same form in an increase or decrease of the wavelength. Hereinafter, although the first-first wavelength pattern P1$a$ and the first-second wavelength pattern P1$b$ are described based on the same row, the description may be applied to the same column. Further, inflection points of the wavelengths in the same row may be the same point in the first-first wavelength pattern P1$a$ and the first-second wavelength pattern P1$b$. That is, the wavelengths of the first-first wavelength pattern P1$a$ and the first-second wavelength pattern P1$b$ may be rapidly increased at the same point. Here, the same point means a region in which rows and columns are the same in one region of different donor substrates or different panel substrates. For example, semiconductor devices disposed in one row and one column of the donor substrates may be semiconductor devices disposed at the same point. Further, the first-first wavelength pattern P1$a$ and the first-second wavelength pattern P1$b$ may be the same as the first wavelength pattern P1. Further, the plurality of donor substrates to which the semiconductor devices are transferred from the second transfer region T2 may have the same number of semiconductor devices having the same wavelength.

As described above, referring to FIG. 14C, the semiconductor devices of the plurality of donor substrates may be transferred to the panel substrate 300. The panel substrate 300 may include a plurality of regions having the same wavelength pattern formed by semiconductor devices disposed in the rows in the row direction. For example, when the panel substrate 300 includes only a plurality of donor substrates transferred from one region of the wafer, the panel substrate 300 may include only a plurality of regions including a plurality of rows in which wavelength patterns are the same in the row direction. However, the present invention is not limited thereto, and, in the panel substrate 300, the plurality of regions including the plurality of rows in which the wavelength patterns are the same in the row direction may be present as some regions of the panel substrate 300.

However, when all semiconductor devices emitting different colored light are transferred to each of the donor substrates, wavelength patterns formed by the semiconductor devices emitting the same colored light may be the same in at least some of the plurality of donor substrates. For example, wavelength patterns formed by semiconductor devices emitting light having a red wavelength may be the same in at least some of the plurality of donor substrates.

While the present invention has been mainly described with reference to the exemplary embodiments, it should be understood that the present invention is not limited to the disclosed exemplary embodiments, and various modifications and applications can be devised by those skilled in the art to which the present invention pertains without departing from the gist of the present invention. For example, each component specifically shown in the exemplary embodiments can be modified and implemented. It should be construed that differences related to these modifications and applications will fall within the scope of the present invention defined by the appended claims.

The invention claimed is:

1. A display device comprising:
 a panel substrate; and
 a plurality of semiconductor devices disposed on the panel substrate,
 wherein the panel substrate includes a first region and a second region disposed in a first direction,
 wherein the plurality of semiconductor devices include a plurality of first semiconductor devices disposed in the first region and a plurality of second semiconductor devices disposed in the second region,
 wherein a first-first wavelength pattern of the plurality of first semiconductor devices is the same as a first-second wavelength pattern of the plurality of second semiconductor devices on the same color emission, and
 wherein the first-first wavelength pattern and the first-second wavelength pattern have the same increase or decrease of wavelengths in the same row or column.

2. The display device of claim 1, wherein the first region and the second region are divided by an alignment mark.

3. The display device of claim 2, wherein a length of one side of each of the plurality of semiconductor devices is less than or equal to 100 μm.

4. The display device of claim 1, wherein:
 the plurality of first semiconductor devices emit at least one among red light, green light, and blue light;

a wavelength deviation of the plurality of semiconductor devices emitting the red light disposed in the first region is within 4 nm;

a wavelength deviation of the plurality of semiconductor devices emitting the green light disposed in the first region is within 6 nm; and a wavelength deviation of the plurality of semiconductor devices emitting the blue light disposed in the first region is within 2 nm.

5. The display device of claim 1, wherein:

the plurality of second semiconductor devices emit at least one among red light, green light, and blue light;

a wavelength deviation of the plurality of semiconductor devices emitting the red light disposed in the second region is within 4 nm;

a wavelength deviation of the plurality of semiconductor devices emitting the green light disposed in the second region is within 6 nm; and a wavelength deviation of the plurality of semiconductor devices emitting the blue light disposed in the second region is within 2 nm.

6. The display device of claim 5, wherein separation distances between first semiconductor devices emitting the same color among the plurality of first semiconductor devices are the same.

7. The display device of claim 1, wherein each of the plurality of semiconductor devices includes a first conductivity type semiconductor layer, a second conductivity type semiconductor layer, and an active layer disposed between the first conductivity type semiconductor layer and the second conductivity type semiconductor layer.

8. The display device of claim 1, wherein the first-first wavelength pattern and the first-second wavelength pattern have inflection points of the wavelengths at the same point.

9. The display device of claim 8, wherein the same point is a region in which a row and a column are the same in the first region and the second region.

10. The display device of claim 1, wherein the first region a first-first region comprising a first semiconductor element providing a first wavelength and a first-second region comprising a first semiconductor element providing a second wavelength.

11. The display device of claim 10, wherein the second region includes a second-first region formed of a second semiconductor element providing the first wavelength and a second-second region formed of a second semiconductor element providing the second wavelength.

12. The display device of claim 11, wherein the first-first region is positioned to correspond to the second-first region.

13. The display device of claim 12, wherein the first-first region is positioned to correspond to the second-first region.

14. The display device of claim 13, wherein the first-first region and the second-first region have the same shape.

15. The display device of claim 13, wherein the first-second region and the second-second region have the same shape.

16. The display device of claim 1, wherein a separation distance between the first semiconductor devices emitting the same color is the same in the first region.

17. The display device of claim 1, wherein a separation distance between the second semiconductor devices emitting the same color is the same in the second region.

18. The display device of claim 1, wherein the first region is disposed adjacent to the second region.

19. The display device of claim 1, wherein a wavelength deviation between the first semiconductor devices disposed at an edge of the first region and the second semiconductor devices disposed at an edge of the second region is within 2 nm.

* * * * *